(12) United States Patent
Åkesson et al.

(10) Patent No.: US 7,976,607 B2
(45) Date of Patent: *Jul. 12, 2011

(54) CEMENTED CARBIDE WITH REFINED STRUCTURE

(75) Inventors: Leif Åkesson, Älvsjö (SE); Susanne Norgren, Huddinge (SE); Alexandra Kusoffsky, Lindingö (SE)

(73) Assignee: Sandvik Intellectual Property AB, Sandviken (SE)

( * ) Notice: Subject to any disclaimer, the term of this patent is extended or adjusted under 35 U.S.C. 154(b) by 40 days.

This patent is subject to a terminal disclaimer.

(21) Appl. No.: 12/303,317

(22) PCT Filed: Jun. 13, 2007

(86) PCT No.: PCT/SE2007/050413
§ 371 (c)(1),
(2), (4) Date: Mar. 9, 2009

(87) PCT Pub. No.: WO2007/145585
PCT Pub. Date: Dec. 21, 2007

(65) Prior Publication Data
US 2009/0242824 A1    Oct. 1, 2009

(30) Foreign Application Priority Data

Jun. 15, 2006   (SE) ...................... 0601312

(51) Int. Cl.
    C22C 29/08    (2006.01)
(52) U.S. Cl. ......................................... 75/240
(58) Field of Classification Search .................... 75/240; 419/18
    See application file for complete search history.

(56) References Cited

U.S. PATENT DOCUMENTS

| | | | |
|---|---|---|---|
| 5,679,448 A | 10/1997 | Kawata | |
| 5,773,735 A * | 6/1998 | Dubensky et al. | 75/240 |
| 6,103,357 A | 8/2000 | Selinder et al. | |
| 6,250,855 B1 | 6/2001 | Persson et al. | |
| 6,261,673 B1 | 7/2001 | Reineck et al. | |
| 6,273,930 B1 | 8/2001 | Waldenström | |
| 6,309,738 B1 | 10/2001 | Sakurai | |
| 6,342,291 B1 | 1/2002 | Jonsson et al. | |
| 6,413,293 B1 | 7/2002 | Grearson et al. | |
| 6,884,499 B2 | 4/2005 | Penich et al. | |
| 7,713,327 B2 * | 5/2010 | Engstrom et al. | 75/240 |
| 7,727,621 B2 | 6/2010 | Nordlöf et al. | |
| 2002/0051887 A1 | 5/2002 | Jonsson et al. | |
| 2004/0187638 A1 * | 9/2004 | Heinrich et al. | 75/240 |
| 2006/0029511 A1 | 2/2006 | Gustafson et al. | |
| 2006/0286410 A1 | 12/2006 | Ahlgren et al. | |
| 2007/0154739 A1 | 7/2007 | Martensson et al. | |
| 2007/0292671 A1 | 12/2007 | Akesson et al. | |
| 2008/0276544 A1 * | 11/2008 | Hirose et al. | 51/307 |

FOREIGN PATENT DOCUMENTS

| | | |
|---|---|---|
| EP | 1 043 413 B1 | 10/2000 |
| EP | 1 038 989 B1 | 6/2004 |
| EP | 1 470 879 A1 | 10/2004 |
| EP | 1 526 189 A1 | 4/2005 |
| EP | 1 676 939 A1 | 7/2006 |
| EP | 1 795 628 A1 | 6/2007 |
| EP | 1 798 308 A2 | 6/2007 |
| EP | 1 798 310 A2 | 6/2007 |
| EP | 1 500 713 | 8/2007 |
| EP | 1 347 076 B1 | 2/2008 |
| EP | 1 900 849 A1 | 3/2008 |
| EP | 1803830 * | 4/2010 |
| JP | 10-110235 | 4/1998 |
| JP | 10-324942 | 12/1998 |
| JP | 10-324943 | 12/1998 |
| JP | 11-152535 | 6/1999 |
| JP | 2001-200329 | 7/2001 |
| JP | 2004-315904 | 11/2004 |
| JP | 2006-117974 * | 5/2006 |
| WO | WO 97/20082 | 6/1997 |
| WO | WO 98/03691 | 1/1998 |
| WO | WO 98/22631 | 5/1998 |
| WO | WO 99/13120 | 3/1999 |
| WO | WO 2006/041366 A1 | 4/2006 |
| WO | WO 2006/043421 | 4/2006 |
| WO | WO 2006/080888 A1 | 8/2006 |

OTHER PUBLICATIONS

Office Action mailed Aug. 13, 2010, in U.S. Appl. No. 12/128,803.
Office Action mailed Oct. 27, 2010, in U.S. Appl. No. 12/128,803.
Office Action mailed Aug. 13, 2010, in U.S. Appl. No. 12/147,587.
Office Action mailed Aug. 13, 2010, in U.S. Appl. No. 12/126,195.
European Search Report dated Nov. 13, 2008, issued in EP 08 10 4014.
European Search Report dated Nov. 11, 2008, issued in EP 08 15 6044.
European Search Report dated Nov. 12, 2008, issued in EP 08 15 7076.
European Search Report dated Nov. 12, 2008, issued in EP 08 15 6057.
International Search Report dated Oct. 3, 2008, issued in PCT/SE2008/050777.
Swedish Office Action mailed Jul. 12, 2007, issued in 0701449-1.
Andersen et al., "Deposition, microstructure and mechanical and tribological properties of magnetron sputtered TiN/TiAlN multilayers," Surface and Coatings Technology, No. 123, 2000, pp. 219-226.
Hsieh et al., "Deposition and characterization of TiAlN and multilayered TiN/TiAlN coatings using unbalanced magnetron sputtering," Surface and Coatings Technology, 108-109, 1998, pp. 132-137.

* cited by examiner

Primary Examiner — Roy King
Assistant Examiner — Ngoclan T Mai
(74) Attorney, Agent, or Firm — Drinker Biddle & Reath LLP

(57) ABSTRACT

The present invention relates to a WC—Co cemented carbide alloy. By adding an extremely small amount of Ti, V, Zr, Ta or Nb or a combination of these, a grain refined cemented carbide structure with less abnormal WC-grains has been obtained.

7 Claims, 1 Drawing Sheet

CEMENTED CARBIDE WITH REFINED STRUCTURE

Figure 1:
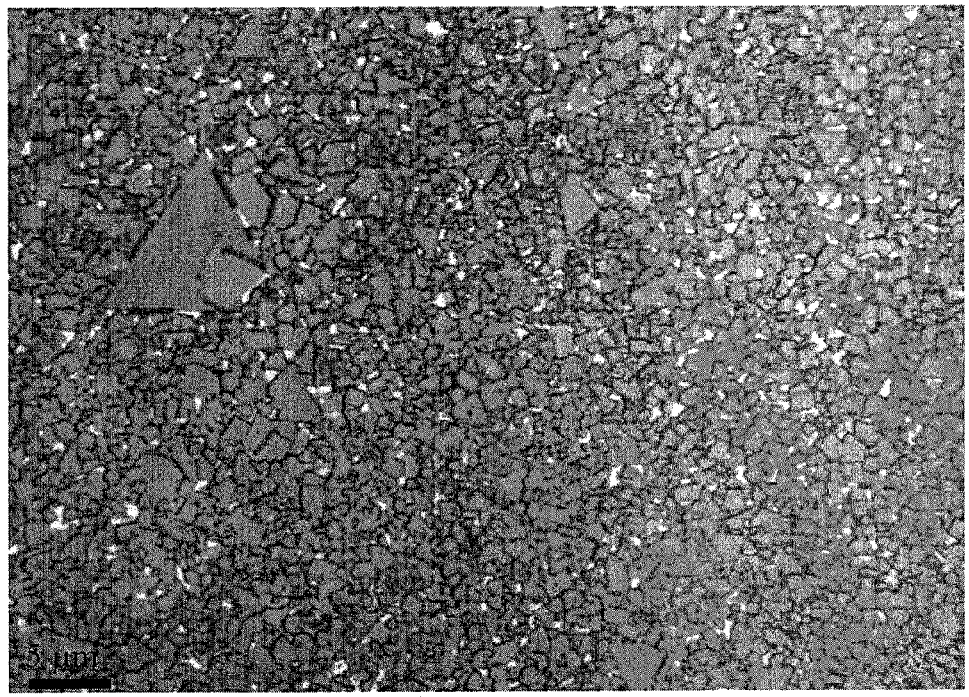

The present invention relates to a cemented carbide alloy. By adding an extremely small amount of Ti, V, Zr, Ta or Nb, or a combination of these, a grain refined cemented carbide structure with less abnormal WC-grains has been obtained.

Cemented carbide cutting tools is used in machining of steel, hardened steel, stainless steels, cast irons and heat resistant alloys in applications with high demands on both toughness and wear resistance. Except for WC and Co cubic carbides like TiC, NbC, TaC, ZrC and HfC are often added in order to achieve the desired properties. These cubic carbides will form a third phase present in the microstructure, the cubic face centered carbide (B1), often called the γ-phase. Whether the cemented carbide is fine-grained or normal-grained it is necessary to keep the grain growth in control during sintering. It well known that when sintering WC—Co grades without inhibitors the grain growth of the WC grains is very rapid and abnormal grain growth takes place such that very large WC grain are present in the structure. These abnormal grains may be detrimental to the cutting performance as they can act as critical flaws and cause breakage. One well known method to control the grain growth is to add cubic carbide formers, generally as carbides TiC, NbC, TaC, ZrC, HfC. However, these additions are usually in the amount such that the cubic carbide phase is present in the microstructure. The drawback, however, is that the toughness compared to a straight WC—Co grade is reduced.

Another method to control the grain growth is to sinter in nitrogen as described in EP-A-1500713 which discloses a method of making a fine grained tungsten carbide-cobalt cemented carbide comprising mixing, milling according to standard practice followed by sintering. By introducing nitrogen at a pressure of more than 0.5 atm into the sintering atmosphere after dewaxing but before pore closure a grain refinement including reduced grain size and less abnormal grains can be obtained.

WO 2006/043421 discloses cemented carbides which include WC having an average particle diameter of <0.3 μm as a hard phase and 5.5 to 15 wt-% of at least one iron group metal element as a binder phase, and comprise, in addition to the above hard phase and binder phase, 0.005 to 0.06 wt-% of Ti, Cr in a weight ratio relative to the binder phase of 0.04 to 0.2. Especially, the above cemented carbides contain no Ta. The above cemented carbides are composed of WC in the alloy which forms uniformly fine particles and is effectively inhibited in the growth to a rough WC, which results in the provision of cemented carbides being excellent in both strength and toughness.

It is an object of the present invention to avoid or alleviate the problems of the prior art.

It is further an object of the present invention to provide cemented carbide cutting tools with improved binder phase distribution and reduced amounts of abnormal WC grains giving cemented carbide tools with improved mechanical and cutting properties.

It has now surprisingly been found that a pronounced grain refining effect in combination with an improved binder phase distribution can be obtained by introduction of Ti, V, Nb, Zr or Ta or a combination of these on ppm-level in a cemented carbide.

FIG. 1 is a Light Optical Micrograph of the microstructure of a cemented carbide according to prior art.

Figure 2:
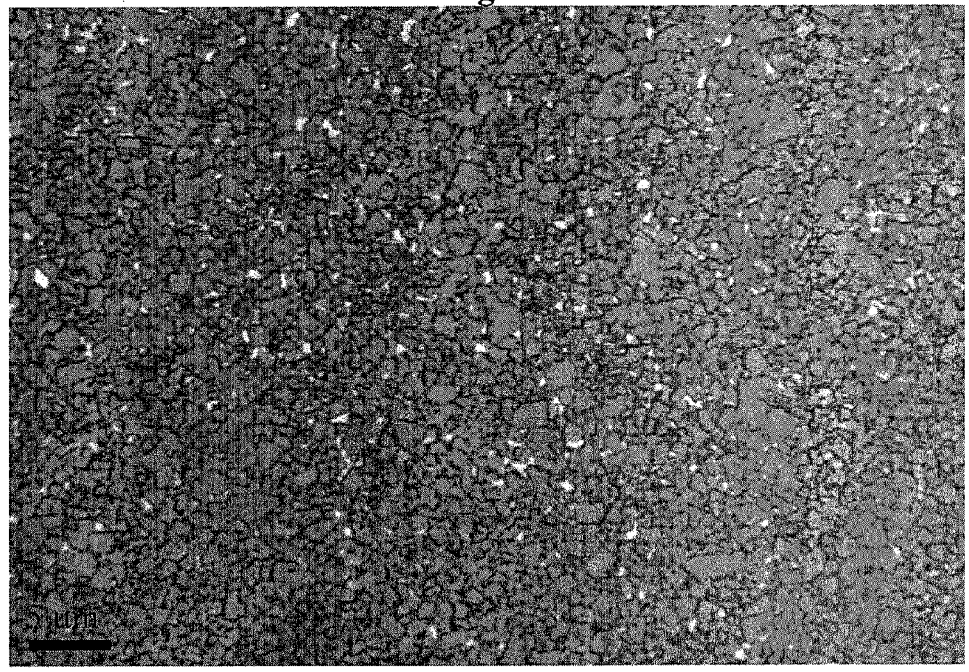

FIG. 2 is a Light Optical Micrograph of the microstructure of a cemented carbide according to the invention The cemented carbide body comprises tungsten carbide with a grain size of 1.0-2.5 μm, with 3-15 wt-% Co and in addition to that ppm levels of the following additional elements Ti, V, Nb, Zr, Ta or mixtures of these such that the ratio of $$Me/\text{Co}=(\text{at-\% Ti}+\text{at-\% V}+\text{at-\% Nb}+\text{at-\% Zr}+\text{at-\% Ta})/\text{at-\% Co}$$

is lower than or equal to $0.014-(CW)*0.008$ and higher than 0.0005, preferably higher than 0.0007, with CW 0.80-0.95, preferably 0.83-0.92 where $$CW=\text{magnetic-\% Co}/\text{wt-\% Co}$$

where magnetic-% Co is the weight percentage of magnetic Co and wt-% Co is the weight percentage of Co in the cemented carbide. The CW is a function of the W content in the Co binder phase. A CW of about 1 corresponds to a very low W-content in the binder phase and a CW of 0.75-0.8 corresponds to a high W-content in the binder phase.

The sintered body may also contain small amounts <0.5% of precipitations of additional phase or phases such as eta-phase, or cubic MX-carbide or carbonitride, where $$M=(V+Zr+Ti+Ta+Nb+W) \text{ and } X=C \text{ or } N.$$

In a first preferred embodiment the additional element is Ti.
In a second preferred embodiment the additional elements is a mixture of Ti and Ta.
In a third preferred embodiment the additional elements is a mixture of Ti, Ta and Nb.
In a fourth preferred embodiment the additional elements is a mixture of Ti and Zr.
In a fifth preferred embodiment the cemented carbide comprises 0.01-0.10 wt-% N.
In a sixth preferred embodiment the additional element(s) is Ti or a mixture of Ti and Ta and in both cases N more than 0.02 wt-% N, preferably more than 0.03 wt-% N but less than 0.10 wt-%.

The method of making the cemented carbide according to the present invention comprises mixing, milling, pressing and sintering of WC—Co bodies according to standard practice. Ppm levels of Ti, V, Nb, Zr or Ta or mixtures thereof are added in such amounts that the Me/Co and CW values according to above are fulfilled in the sintered cemented carbide. The Ti, V, Nb, Zr or Ta may be added as pure metals or as a carbides, nitrides and/or carbonitrides or mixtures thereof.

EXAMPLE 1

Cemented carbide bodies 1A-1F with the following compositions in wt-% in addition to 9.25 wt-% Co and WC as rest were prepared.

TABLE 1a

| | (elements in wt-% added as carbides) | | | | | |
|---|---|---|---|---|---|---|
| Variant | Ti | V | Zr | Ta | Nb | |
| 1A | — | — | — | — | — | ref |
| 1B | 0.025 | — | — | — | — | inv |
| 1C | — | 0.027 | — | — | — | inv |
| 1D | 0.02 | — | 0.025 | — | — | inv |
| 1E | — | — | — | 0.095 | — | inv |
| 1F | — | — | — | — | 0.049 | inv |

The mixtures were wet milled, dried, compacted and sintered at 1410° C., respectively, in a protective atmosphere of Ar at a pressure of 40 mbar for 1 h. After sintering CW, Me/Co, 0.014−(CW)*0.008 and the as sintered grain size were determined and presented in table 1b.

TABLE 1b

| Variant | CW | Me/Co | 0.014−(CW)*0.008 | As sintered $d_{WC}$ (µm) |
|---------|------|---------|------------------|---------------------------|
| 1A | 0.91 | NA | NA | 1.7 |
| 1B | 0.90 | 0.00331 | 0.00680 | 1.4 |
| 1C | 0.89 | 0.00331 | 0.00688 | 1.3 |
| 1D | 0.91 | 0.00441 | 0.00672 | 1.4 |
| 1E | 0.91 | 0.00331 | 0.00672 | 1.3 |
| 1F | 0.90 | 0.00331 | 0.00680 | 1.4 |

NA = Not applicable

The surprising effect of low additions cubic carbide formers on the as sintered WC grain size is clearly demonstrated.

EXAMPLE 2

Cemented carbide variants 2A-2E with compositions as given in Table 2a were prepared according to the same method as in Example 1. WC-powder supplied from H. C. Starck and a WC-powder with 0.08 wt-% N both with an FSSS grain size of 1.3 µm were used together with fine grain cobalt-powder from OMG and fine grain TiC, TaC, NbC from H. C. Starck.

TABLE 2a

| Element in wt-% | elements in wt-% | | | | | | |
|---|---|---|---|---|---|---|---|
| | Co | Ti | Ta | Nb | N | WC | |
| 2A | 6.0 | — | — | — | — | Rest | Ref |
| 2B | 6.0 | 0.030 | — | — | — | Rest | Inv |
| 2C | 6.0 | 0.010 | 0.009 | — | 0.06 | Rest | Inv |
| 2D | 6.0 | 0.007 | 0.009 | 0.007 | 0.06 | Rest | Inv |
| 2E | 6.0 | — | 0.014 | 0.014 | 0.06 | Rest | Inv |

The mixtures were wet milled, dried, compacted and sintered at 1450° C., respectively, in a protective atmosphere of Ar at a pressure of 40 mbar for 1 h. After sintering CW, Me/Co, 0.014−(CW)*0.008 and the as sintered grain size were determined and presented in table 2b.

In addition the sintered bodies were cut, ground and polished and etched. The cross sections were investigated by light optical microscopy and the number of WC-grains larger than 10 µm in any directions was calculated. The results are given in table 2b.

TABLE 2b

| | CW | Me/Co | 0.014−0.008*CW | $d_{WC}$ (µm) | No of WC-grains/ $cm^2 > 10$ µm | |
|---|------|---------|---------|-----|-----|------|
| 2A | 0.90 | NA | NA | 1.8 | 133 | Ref FIG. 1. |
| 2B | 0.90 | 0.00616 | 0.00680 | 1.4 | 19 | Inv FIG. 2. |
| 2C | 0.88 | 0.00257 | 0.00696 | 1.5 | 21 | Inv |
| 2D | 0.90 | 0.00267 | 0.00680 | 1.5 | 24 | Inv |
| 2E | 0.88 | 0.00387 | 0.00696 | 1.6 | 35 | Inv |

From Examples 1 and 2 it is evident that the variants according to the invention have a microstructure with much less large grains and a general finer grain size due to the strong grain refining effect of the low levels of Ti, Ta, Zr, Nb or V-additions.

The invention claimed is:

1. WC—Co cemented carbide comprising a WC grain size of 1.0-2.5 µm and a Co-content of 3-15 wt-% Co and in addition to that ppm levels of the following elements Ti, V, Nb, Zr or Ta or mixtures of these such that the ratio of Me/Co=(at-% Ti+at-% V+at-% Nb+at-% Zr+at-% Ta) /at-% Co is lower than or equal to 0.014−(CW) *0.008 and higher than 0.0005 with CW 0.80-0.95 where CW=magnetic-% Co/wt-% Co where magnetic-% Co is the weight percentage of magnetic Co and wt-% Co is the weight percentage of Co in the cemented carbide.

2. Cemented carbide according to claim 1 wherein the additional element is Ti.

3. Cemented carbide according to claim 1 wherein the additional element is a mixture of Ti and Ta.

4. Cemented carbide according to claim 1 wherein the additional element is mixture of Ti, Ta and Nb.

5. Cemented carbide according to claim 1 wherein the additional element is mixture of Ti and Zr.

6. Cemented carbide according to claim 1 comprising 0.01-0.10 wt-% N.

7. Cemented carbide according to claim 1 wherein the additional element is the additional element(s) is Ti or a mixture of Ti and Ta in both cases with a N-content of more than 0.02 wt-%.

* * * * *